(12) United States Patent
Mori et al.

(10) Patent No.: US 8,569,892 B2
(45) Date of Patent: Oct. 29, 2013

(54) SEMICONDUCTOR DEVICE AND MANUFACTURING METHOD THEREOF

(75) Inventors: Kentaro Mori, Tokyo (JP); Daisuke Ohshima, Tokyo (JP); Shintaro Yamamichi, Tokyo (JP); Hideya Murai, Tokyo (JP); Katsumi Maeda, Tokyo (JP); Katsumi Kikuchi, Tokyo (JP); Yoshiki Nakashima, Tokyo (JP)

(73) Assignee: NEC Corporation, Tokyo (JP)

( * ) Notice: Subject to any disclaimer, the term of this patent is extended or adjusted under 35 U.S.C. 154(b) by 218 days.

(21) Appl. No.: 13/062,262

(22) PCT Filed: Oct. 5, 2009

(86) PCT No.: PCT/JP2009/067349
§ 371 (c)(1),
(2), (4) Date: Mar. 30, 2011

(87) PCT Pub. No.: WO2010/041630
PCT Pub. Date: Apr. 15, 2010

(65) Prior Publication Data
US 2011/0175213 A1    Jul. 21, 2011

(30) Foreign Application Priority Data

Oct. 10, 2008 (JP) ................................ 2008-264141

(51) Int. Cl.
*H01L 23/48* (2006.01)
*H01L 23/10* (2006.01)
(52) U.S. Cl.
USPC .... 257/774; 257/787; 257/707; 257/E23.145; 257/701; 257/784

(58) Field of Classification Search
USPC ............................ 257/774, 787, E23.145, 706
See application file for complete search history.

(56) References Cited

U.S. PATENT DOCUMENTS

| | | | | |
|---|---|---|---|---|
| 5,497,033 | A | * | 3/1996 | Fillion et al. .................. 257/723 |
| 5,870,289 | A | * | 2/1999 | Tokuda et al. ................ 361/779 |
| 6,268,648 | B1 | * | 7/2001 | Fukutomi et al. ............. 257/678 |

(Continued)

FOREIGN PATENT DOCUMENTS

| JP | 2001144245 A | 5/2001 |
|---|---|---|
| JP | 3277997 B | 4/2002 |

(Continued)

OTHER PUBLICATIONS

International Search Report for PCT/JP2009/067349 mailed Nov. 10, 2009.

*Primary Examiner* — Nitin Parekh

(57) ABSTRACT

A semiconductor device includes: at least one semiconductor element having electrode terminals; a metal plate supporting the semiconductor element; and a wiring board covering the semiconductor element and including a plurality of insulating layers and wiring layers alternately stacked and external connection terminals on a surface, the wiring layers being electrically connected to each other by vias. The electrode terminals and the external connection terminals are electrically connected via at least one of the wiring layers and the vias. At least one of the electrode terminals, the is wiring layers, and the vias is electrically connected to the metal plate.

9 Claims, 18 Drawing Sheets

(EXAMPLE 3)

(56) References Cited

U.S. PATENT DOCUMENTS

| | | | |
|---|---|---|---|
| 6,271,469 B1 * | 8/2001 | Ma et al. | 174/521 |
| 6,365,980 B1 * | 4/2002 | Carter et al. | 257/787 |
| 6,495,914 B1 * | 12/2002 | Sekine et al. | 257/723 |
| 6,507,114 B2 * | 1/2003 | Hui et al. | 257/738 |
| 6,555,906 B2 * | 4/2003 | Wermer et al. | 257/723 |
| 7,911,047 B2 * | 3/2011 | Hasegawa et al. | 257/690 |
| 2002/0060361 A1 * | 5/2002 | Sasaki | 257/698 |

FOREIGN PATENT DOCUMENTS

| | | |
|---|---|---|
| JP | 2003101243 A | 4/2003 |
| JP | 2003318311 A | 11/2003 |
| JP | 2004179227 A | 6/2004 |
| JP | 2007035989 A | 2/2007 |
| JP | 2007335496 A | 12/2007 |

* cited by examiner (EXAMPLE 1)

(EXAMPLE 1)

VARIATION 1

(EXAMPLE 1)

VARIATION 2

(EXAMPLE 1)

VARIATION 3

(EXAMPLE 1)

VARIATION 4

(EXAMPLE 1)

VARIATION 5

FIG. 7A (EXAMPLE 1)
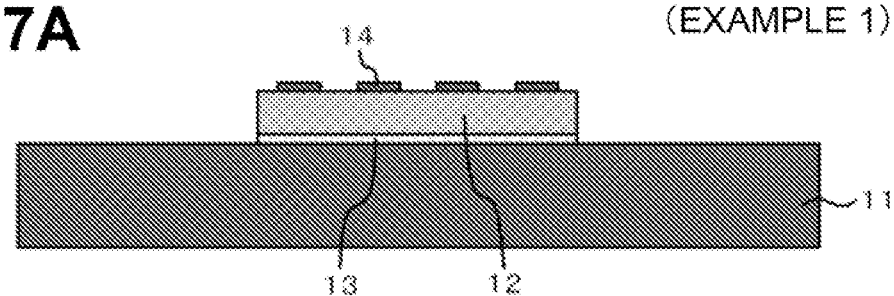
FIG. 7B (EXAMPLE 1)
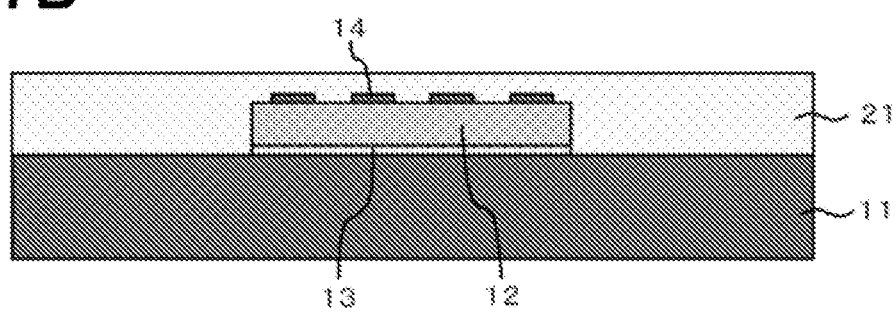
FIG. 7C (EXAMPLE 1)
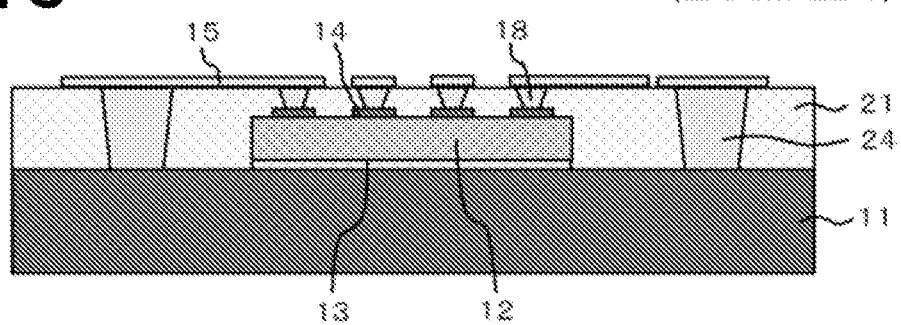
FIG. 7D (EXAMPLE 1)
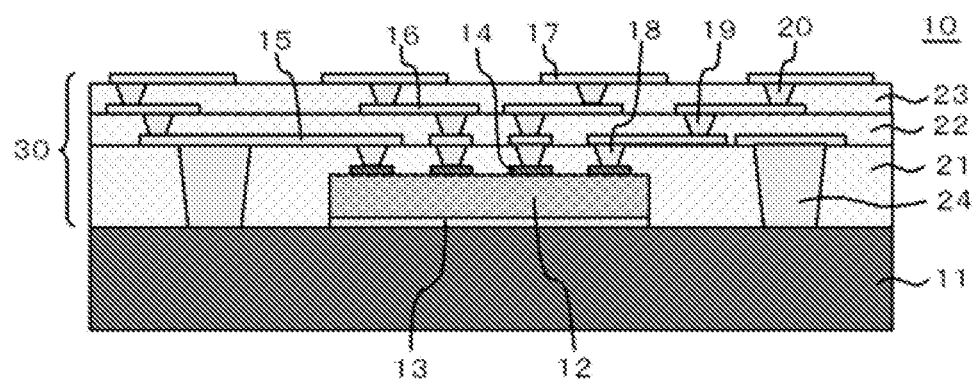

(EXAMPLE 1)

(EXAMPLE 1)

VARIATION 1

(EXAMPLE 1) VARIATION 5-1

(EXAMPLE 1) VARIATION 5-1

(EXAMPLE 1) VARIATION 5-1

(EXAMPLE 1) VARIATION 5-1

(EXAMPLE 1) VARIATION 5-1

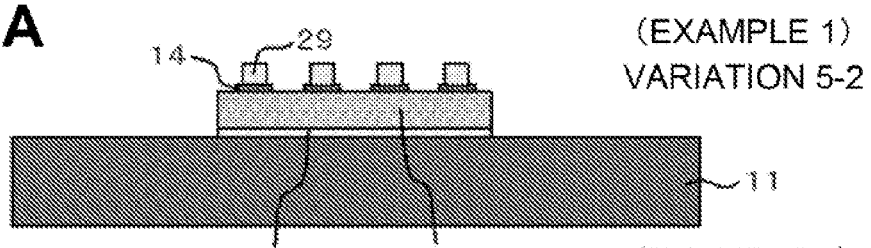
FIG. 11A (EXAMPLE 1) VARIATION 5-2
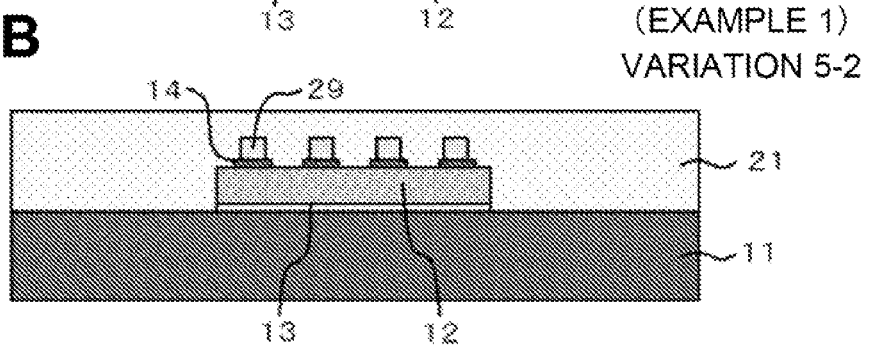
FIG. 11B (EXAMPLE 1) VARIATION 5-2
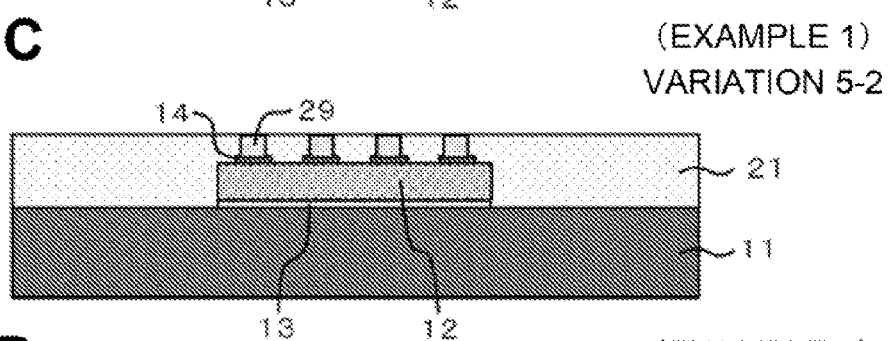
FIG. 11C (EXAMPLE 1) VARIATION 5-2
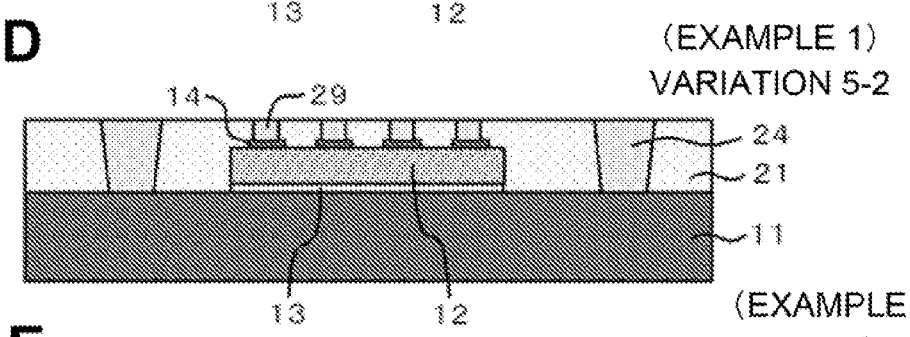
FIG. 11D (EXAMPLE 1) VARIATION 5-2
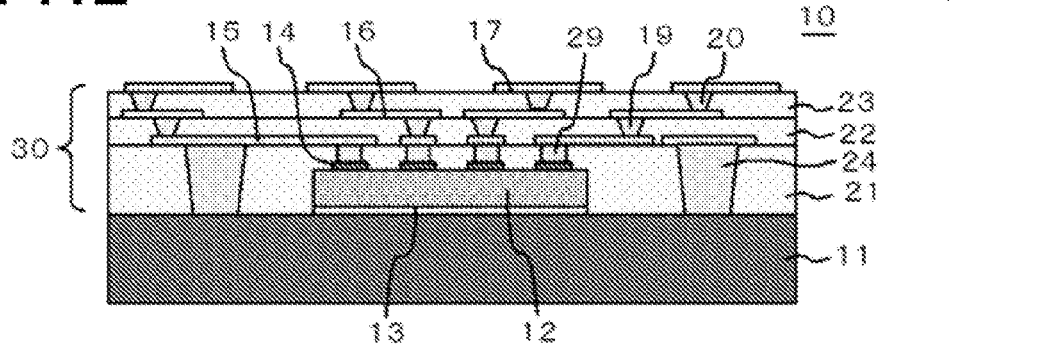
FIG. 11E (EXAMPLE 1) VARIATION 5-2

(EXAMPLE 2)

FIG. 13A (EXAMPLE 2)
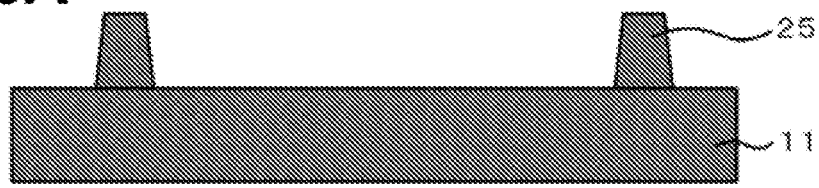
FIG. 13B (EXAMPLE 2)
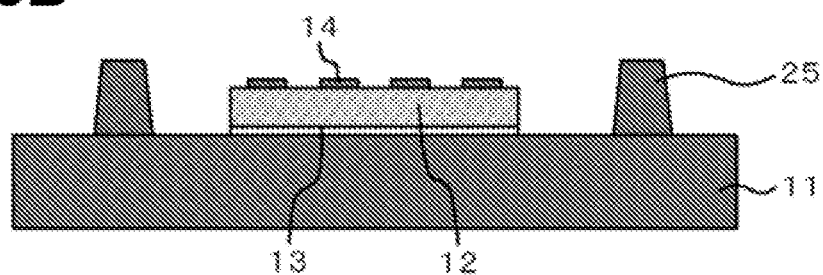
FIG. 13C (EXAMPLE 2)
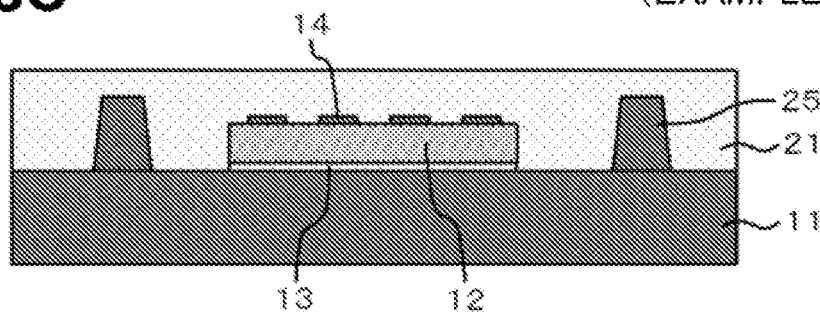
FIG. 13D (EXAMPLE 2)
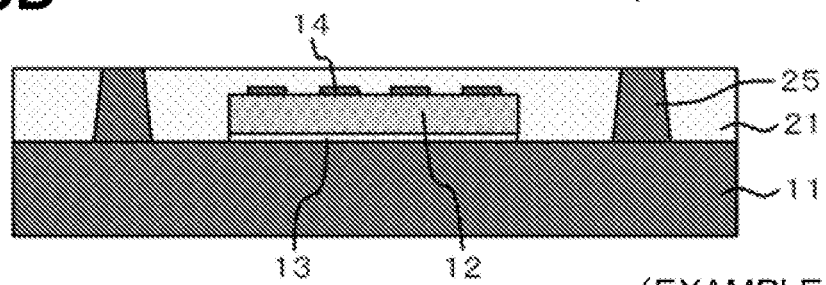
FIG. 13E (EXAMPLE 2)
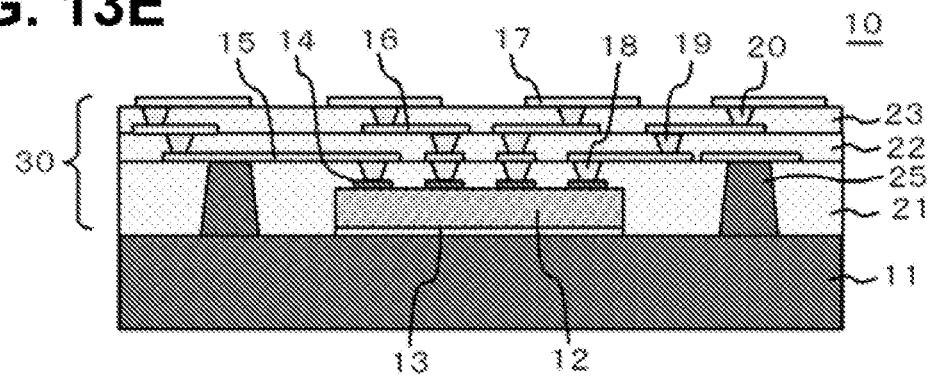

(EXAMPLE 3)

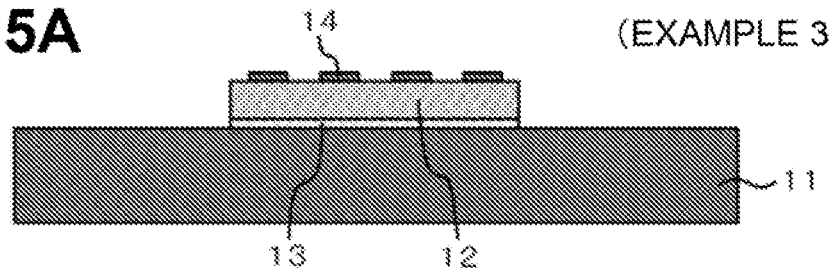
FIG. 15A (EXAMPLE 3)
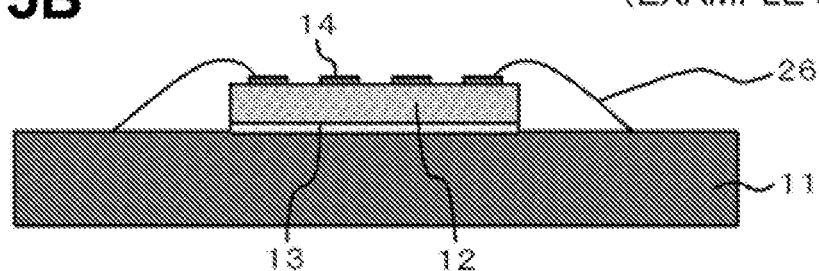
FIG. 15B (EXAMPLE 3)
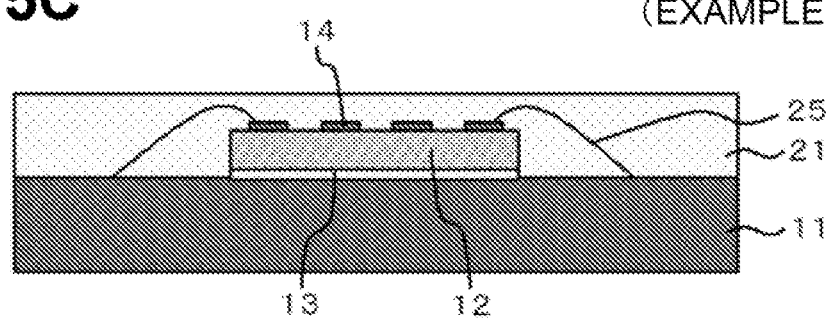
FIG. 15C (EXAMPLE 3)
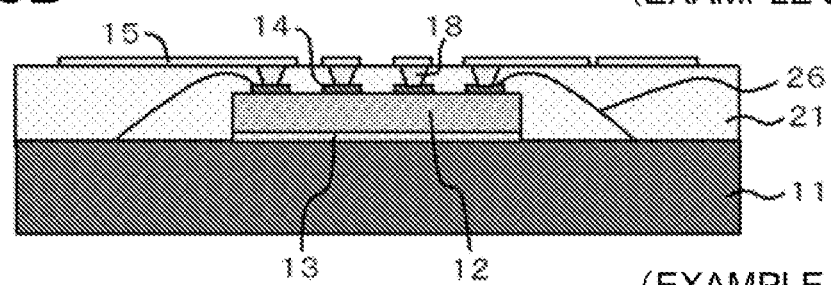
FIG. 15D (EXAMPLE 3)
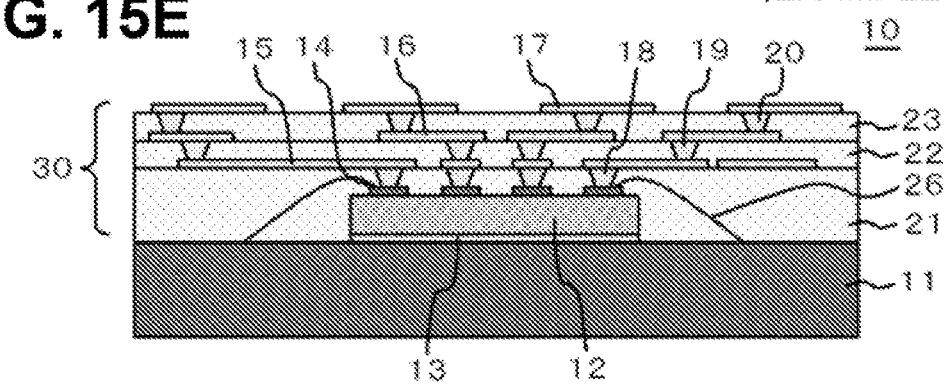
FIG. 15E (EXAMPLE 3)

(CONVENTIONAL EXAMPLE 1)

(CONVENTIONAL EXAMPLE 2)

(CONVENTIONAL EXAMPLE 3)

SEMICONDUCTOR DEVICE AND MANUFACTURING METHOD THEREOF

REFERENCE TO RELATED APPLICATION

This application is the National Phase of PCT/JP2009/067349, filed Oct. 5, 2009, which is based upon and claims the benefit of the priority of Japanese patent application No. 2008-264141 filed on Oct. 10, 2008, the disclosure of which is incorporated herein in its entirety by reference thereto.

TECHNICAL FIELD

The present invention relates to a semiconductor device and a manufacturing method thereof. In particular, the present invention relates to a semiconductor device including a wiring board incorporating a semiconductor element covered with an insulating layer of resin or the like on which multiple wiring layers and insulating layers are stacked and to a manufacturing method of the semiconductor device.

BACKGROUND

In recent years, to realize smaller and thinner electronic devices with more enhanced functions and performance, high-density packaging techniques for semiconductor packages are demanded. Conventionally, a wiring board and a semiconductor element are connected to each other by wire bonding using a gold wire or the like or by flip-chip bonding using a solder ball. However, both wire bonding and flip-chip bonding have problems. While wire bonding is advantageous in cost, a wire diameter needs to be decreased to narrow a pitch, causing problems such as wire disconnection and strict connection conditions. Compared with wire bonding, flip-chip bonding enables higher-speed transmission. However, if the number of semiconductor element terminals is increased or if a narrow pitch connection is used, connection strength of solder bumps is decreased. Thus, cracks are generated at connection parts or defective connection is caused by voids.

In view of such background, as a high-density packaging technique that realizes a semiconductor device with higher integration and more enhanced functions and that provides many advantages such as thinner packaging, lower cost, high frequency management, and lower-stress connection, there has been proposed a semiconductor device including a wiring board incorporating a semiconductor element having an electrode terminal from which a wiring directly extends. Namely, a board incorporating a semiconductor element has been proposed.

Meanwhile, along with a recent increase in the speed and density of the semiconductor element, electromagnetic noise or heat generation is causing erroneous device operations and is degrading device performance. Thus, many means to solve these problems have been proposed.
Patent Document 1:
Japanese Patent No. 3277997
Patent Document 2:
Japanese Patent Kokai Publication No. JP-P2004-179227 A
Patent Document 3:
Japanese Patent Kokai Publication No. JP-P2007-335496 A

SUMMARY

The entire disclosures of the above Patent Documents 1 to 3 are incorporated herein by reference thereto. The following analyses are given by the present invention.

Patent Document 1 discloses a board incorporating a semiconductor element. This board includes a metal heat sink 101 on which an IC chip 103 is mounted with the circuit side thereof up, and the IC chip 103 is embedded in an insulating layer resin layer 104a. IC-side mount pads 131 and BGA mount pads 108 are connected by wiring conductors 107 without using solder in between (see FIG. 16). According to this document, since the metal heat sink 101 is used, a package with excellent heat radiation characteristics is realized. However, since the metal heat sink 101 is not electrically connected to the wiring conductors 107, the metal heat sink 101 functions as an antenna receiving noise emitted from peripheral devices or the (built-in) IC chip 103, causing concerns about performance degradation or malfunctions of the (built-in) IC chip 103 or the entire device.

Patent Document 2 discloses an electronic component mount board 210. According to this document, a heat radiation board portion 213 and ground-side patterns 216b of a main board 214 are connected to each other via solder bumps 219 (FIG. 17). The heat radiation board portion 213 functions as a ground-side conductor and realizes both an improved characteristic impedance and a high heat radiation configuration. However, since mount components 212 are connected to the main board 214 by flip-chip bonding, problems are caused if the number of terminals of the mount components 212 is increased or narrow pitch connection is used.

Patent Document 3 discloses a device including an LSI package 301 and a heat sink 306 connected to each other via metal contacts 305 (FIG. 18). According to this document, an LSI chip 301 is shielded and radiation noise is reduced. However, since the heat sink 306 is of an installation type, reduction in the thickness and cost of the package cannot be expected.

It is a primary object of the present invention to provide a semiconductor device and a manufacturing method thereof. The semiconductor device realizes improvement in characteristic impedance, reduction in unwanted electromagnetic radiation, and improvement in heat radiation characteristics, while preventing performance degradation and malfunctions of a semiconductor element. Since the semiconductor device can accommodate an increase of the number of terminals of the semiconductor element and narrow pitch connection, the thickness and cost of the package can be reduced.

According to a first aspect of the present invention, a semiconductor device comprises: at least one semiconductor element having electrode terminals; a metal plate supporting the semiconductor element; and a wiring board covering the semiconductor element and including a plurality of insulating layers and wiring layers alternately stacked and external connection terminals on a surface, the wiring layers being electrically connected to each other by vias, wherein the electrode terminals and the external connection terminals are electrically connected via at least one of the wiring layers and the vias, and wherein at least one of the electrode terminals, the wiring layers, and the vias is electrically connected to the metal plate (mode 1).

In addition, the following modes are possible.

Based on the semiconductor device according to the present invention, it is preferable that the wiring layers or the vias be electrically connected to the metal plate via a second via arranged around the semiconductor element (mode 1-1).

Based on the semiconductor device according to the present invention, it is preferable that the wiring layers or the vias be electrically connected to the metal plate via a metal post arranged around the semiconductor element (mode 1-2).

Based on the semiconductor device according to the present invention, it is preferable that the electrode terminals and the metal plate be electrically connected to each other via a bonding wire (mode 1-3).

Based on the semiconductor device according to the present invention, it is preferable that a pitch of the electrode terminals be narrower than a pitch of the external connection terminals (mode 1-4).

Based on the semiconductor device according to the present invention, it is preferable that insulating material of one of the insulating layers be different from insulating material of the other insulating layers (mode 1-5).

Based on the semiconductor device according to the present invention, it is preferable that the insulating layers covering the semiconductor element be formed so that insulating material covering side end surfaces of the semiconductor element is different from insulating material covering an electrode-terminal-side surface of the semiconductor element (mode 1-6).

Based on the semiconductor device according to the present invention, it is preferable that a second metal post be arranged on the surface of each of the electrode terminals of the semiconductor element and that the second metal posts be formed to be connected to predetermined wirings of the wiring board (mode 1-7).

Based on the semiconductor device according to the present invention, it is preferable that the metal plate have a recessed portion in a semiconductor-element-side surface and that the semiconductor element be arranged in the recessed portion (mode 1-8).

Based on the semiconductor device according to the present invention, it is preferable that the metal plate have an opening and that the semiconductor element be arranged in the opening (mode 1-9).

Based on the semiconductor device according to the present invention, it is preferable that a heat sink be arranged on a surface of the metal plate, the surface being opposite to the semiconductor-element-side surface (mode 1-10).

Based on the semiconductor device according to the present invention, it is preferable that a bonding layer be arranged at least between the metal plate and the semiconductor element (mode 1-11).

Based on the semiconductor device according to the present invention, it is preferable that the bonding layer be formed of a same material as an insulating material of the insulating layer covering side end surfaces of the semiconductor element (mode 1-12).

According to a second aspect of the present invention, a semiconductor device manufacturing method comprises: mounting a semiconductor element on a metal plate, with a surface on which electrode terminals are arranged up; forming a first insulating layer covering the semiconductor element on the metal plate; forming a second via running through the first insulating layer on the metal plate; forming a first wiring layer on the first insulating layer including the second via; and forming a wiring board on the first insulating layer including the first wiring layer, the wiring board including a plurality of insulating layers and wiring layers alternately stacked, the wiring layers being connected to each other by vias (mode 2).

According to a third aspect of the present invention, a semiconductor device manufacturing method comprises: forming a metal post on a metal plate; mounting a semiconductor element on a surface of the metal plate on which the metal post is arranged, with a surface on which electrode terminals are mounted up; forming a first insulating layer covering the semiconductor element and the metal post on the metal plate; removing part of the first insulating layer until a surface of the metal post is exposed; forming a first wiring layer on the first insulating layer including the metal post; and forming a wiring board on the first insulating layer including the first wiring layer, the wiring board including a plurality of insulating layers and wiring layers alternately stacked, the wiring layers being connected to each other by vias (mode 3).

According to a fourth aspect of the present invention, a semiconductor device manufacturing method comprises: mounting a semiconductor element on a metal plate, with a surface on which electrode terminals are arranged up; connecting the electrode terminals and the metal plate via bonding wires; forming a first insulating layer covering the semiconductor element on the metal plate; forming a first wiring layer on the first insulating layer: and forming a wiring board on the first insulating layer including the first wiring layer, the wiring board including a plurality of insulating layers and wiring layers alternately stacked, the wiring layers being connected to each other by vias (mode 4).

In addition, the following modes are possible.

Based on the semiconductor device manufacturing method according to the present invention, it is preferable that the method comprise the forming first vias running through the first insulating layer on the electrode terminals between the forming the first insulating layer and the forming the first wiring layer and that, in the forming the first wiring layer, a first wiring layer be formed on the first insulating layer including the first vias (mode 2-1, mode 3-1, mode 4-1).

Based on the semiconductor device manufacturing method according to the present invention, it is preferable that, in the mounting the semiconductor element, the semiconductor element having the electrode terminals on which second metal posts are arranged be mounted, that the semiconductor device manufacturing method comprise the removing part of the first insulating layer until a surface of each of the second metal posts is exposed between the forming the first insulating layer and the forming the first wiring layer, and that, in the forming the first wiring layer, a first wiring layer be formed on the first insulating layer including the second metal posts (mode 2-2, mode 3-2, mode 4-2).

Based on the semiconductor device manufacturing method according to the present invention, it is preferable that, in the forming the first insulating layer, the electrode-terminal-side surface and the side end surfaces of the semiconductor element be covered with insulating material by stacking the insulating material at once (mode 2-3, mode 3-3, mode 4-3).

Based on the semiconductor device manufacturing method according to the present invention, it is preferable that, in the forming the first insulating layer, after the electrode-terminal-side surface of the semiconductor element is covered with a first insulating material, the side end surface of the semiconductor element be covered with a second insulating material different from the first insulating material (mode 2-3, mode 3-3, mode 4-3).

According to the present invention, by electrically connecting a metal plate, wiring layers and vias of a wiring board, and electrode terminals of a semiconductor element, it becomes possible to improve a characteristic impedance, reduce unwanted electromagnetic radiation, and improve heat radiation characteristics, while preventing performance degradation and malfunctions of a semiconductor element. In addition, since it is possible to accommodate an increase of the number of terminals of the semiconductor element and narrow pitch connection, the thickness and cost of the package can be reduced.

BRIEF DESCRIPTION OF THE DRAWINGS

FIGS. 7A-7D schematically illustrates sectional views of a manufacturing method of the semiconductor device according to example 1 of the present invention.

FIGS. 11A-11E schematically illustrate second sectional views of a variation (corresponding to variation 5 (FIG. 6)) in the manufacturing method of the semiconductor device according to example 1 of the present invention.

FIGS. 13A-13E schematically illustrates sectional views of a manufacturing method of the semiconductor device according to example 2 of the present invention.

FIGS. 15A-15E schematically illustrates sectional views of a manufacturing method of the semiconductor device according to example 3 of the present invention.

PREFERRED MODES

Figure 1:
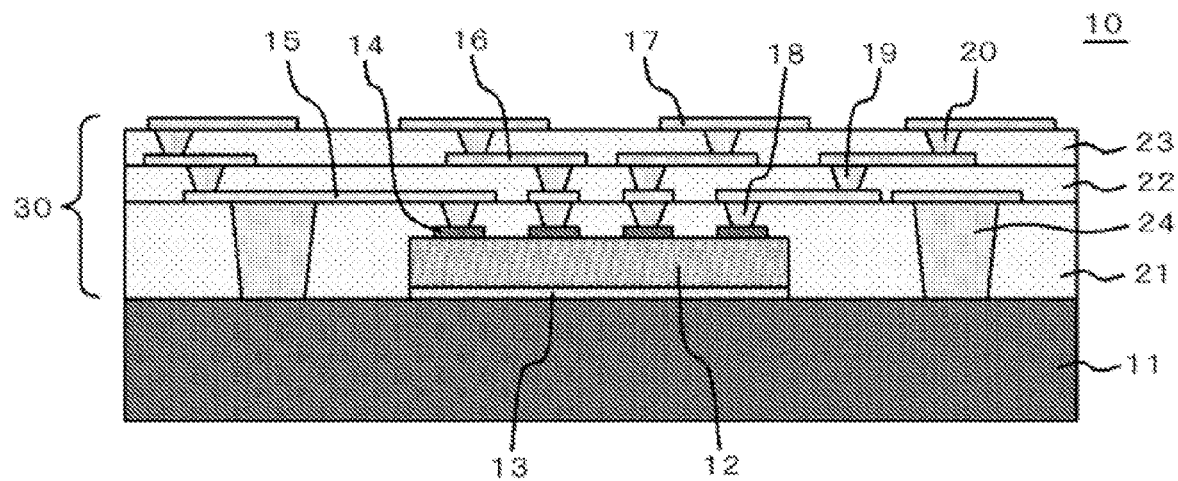
FIG. 1 is a sectional view schematically illustrating a configuration of a semiconductor device according to example 1 of the present invention.

A semiconductor device according to exemplary embodiment 1 of the present invention comprises: at least one semiconductor element (12 in FIG. 1) having electrode terminals (14 in FIG. 1); a metal plate (11 in FIG. 1) supporting the semiconductor element (12 in FIG. 1); and a wiring board (30 in FIG. 1) covering the semiconductor element (12 in FIG. 1) and including a plurality of insulating layers (21, 22, 23 in FIG. 1) and wiring layers (15, 16, 17 in FIG. 1) alternately stacked and external connection terminals (17 in FIG. 1) on a surface, the wiring layers (15, 16, 17 in FIG. 1) being electrically connected to each other by vias (18, 19, 20 in FIG. 1), wherein the electrode terminals (14 in FIG. 1) and the external connection terminals (17 in FIG. 1) are electrically connected via at least one of the wiring layers (15, 16, 17 in FIG. 1) and the vias (18, 19, 20 in FIG. 1), and wherein at least one of the electrode terminals (14 in FIG. 1), the wiring layers (15, 16, 17 in FIG. 1), and the vias (18, 19, 20 in FIG. 1) is electrically connected to the metal plate (11 in FIG. 1).

A semiconductor device manufacturing method according to exemplary embodiment 2 of the present invention comprises: mounting a semiconductor element (12 in FIG. 7A) on a metal plate (11 in FIG. 7A), with a surface on which electrode terminals (14 in FIG. 7A) are arranged up; forming a first insulating layer (21 in FIG. 7B) covering the semiconductor element (12 in FIG. 7B) on the metal plate (11 in FIG. 7B); forming a second via (24 in FIG. 7C) running through the first insulating layer (II in FIG. 7C) on the metal plate (11 in FIG. 7C); forming a first wiring layer (15 in FIG. 7C) on the first insulating layer (21 in FIG. 7C) including the second via (24 in FIG. 7C); and forming a wiring board (30 in FIG. 7D) on the first insulating layer (21 in FIG. 7D) including the first wiring layer (15 in FIG. 7D), the wiring board (30 in FIG. 7D) including a plurality of insulating layers (22, 23 in FIG. 7D) and wiring layers (16, 17 in FIG. 7D) alternately stacked, the wiring layers (16, 17 in FIG. 7D) being connected to each other by vias (19, 20 in FIG. 7D).

A semiconductor device manufacturing method according to exemplary embodiment 3 of the present invention comprises: forming a metal post (25 in FIG. 13A) on a metal plate (11 in FIG. 13A); mounting a semiconductor element (12 in FIG. 13B) on a surface of the metal plate (11 in FIG. 13B) on which the metal post (25 in FIG. 13B) is arranged, with a surface on which electrode terminals (14 in FIG. 13B) are mounted up; forming a first insulating layer (21 in FIG. 13C) covering the semiconductor element (12 in FIG. 13C) and the metal post (25 in FIG. 13C) on the metal plate (11 in FIG. 13C); removing part of the first insulating layer (21 in FIG. 13D) until a surface of the metal post (25 in FIG. 13D) is exposed; forming a first wiring layer (15 in FIG. 13E) on the first insulating layer (21 in FIG. 13E) including the metal post (25 in FIG. 13E); and forming a wiring board (30 in FIG. 13E) on the first insulating layer (21 in FIG. 13E) including the first wiring layer (15 in FIG. 13E), the wiring board (30 in FIG. 13E) including a plurality of insulating layers (22, 23 in FIG. 13E) and wiring layers (16, 17 in FIG. 13E) alternately stacked, the wiring layers (16, 17 in FIG. 13E) being connected to each other by vias (19, 20 in FIG. 13E).

A semiconductor device manufacturing method according to exemplary embodiment 4 of the present invention comprises: mounting a semiconductor element (12 in FIG. 15A) on a metal plate (11 in FIG. 15A), with a surface on which electrode terminals (14 in FIG. 15A) are arranged up; connecting the electrode terminals (14 in FIG. 15B) and the metal plate (11 in FIG. 15B) via bonding wires (26 in FIG. 15B); forming a first insulating layer (21 in FIG. 15C) covering the semiconductor element (12 in FIG. 15C) on the metal plate (11 in FIG. 15C); forming a first wiring layer (15 in FIG. 15D) on the first insulating layer (21 in FIG. 15D); and forming a wiring board on the first insulating layer (21 in FIG. 15E) including the first wiring layer (15 in FIG. 15E), the wiring board including a plurality of insulating layers (22, 23 in FIG. 15E) and wiring layers (16, 17 in FIG. 15E) alternately stacked, the wiring layers (16, 17 in FIG. 15E) being connected to each other by vias (19, 20 in FIG. 15E).

Example 1

A semiconductor device according to example 1 of the present invention will be described with reference to the drawings. FIG. 1 is a sectional view schematically illustrating a configuration of the semiconductor device according to example 1 of the present invention. FIGS. 2 to 6 are sectional views each schematically illustrating a configuration of a variation of the semiconductor device according to example 1 of the present invention.

A semiconductor device 10 of FIG. 1 includes a wiring board 30 (multilayered wiring board) that is arranged on a metal plate 11 and that incorporates a semiconductor element 12 (an IC chip, for example). The semiconductor element 12 has a plurality of electrode terminals 14 on a circuit-side surface thereof (upper side in FIG. 1). The metal plate 11 mainly supports the semiconductor element 12 and is bonded to the back-side surface (lower side in FIG. 1) of the semiconductor element 12 via a bonding layer 13. The bonding layer 13 is arranged on the back surface of the semiconductor element 12.

The wiring board 30 is formed to cover the semiconductor element 12 arranged above the metal plate 11. The wiring board 30 is formed by stacking a first insulating resin 21, first wirings 15, a second insulating resin 22, second wirings 16, a third insulating resin 23, and third wirings 17 in this order on the metal plate 11. The wiring board 30 includes: first vias 18 each electrically connecting a corresponding electrode terminal 14 and first wiring 15; second vias 19 each electrically connecting a corresponding first wiring 15 and second wiring 16; third vias 20 each electrically connecting a corresponding second wiring 16 and third wiring 17; and fourth vias 24 each electrically connecting a corresponding first wiring 15 and the metal plate 11. The first insulating resin 21 covers the circuit-side surface and the side-end surfaces of the semiconductor element 12 and includes prepared holes each at a predetermined position between the metal plate 11 and a first wiring 15, so that a first via 18 is embedded in the prepared hole. In addition, the first insulating resin 21 includes prepared holes each at a predetermined position between a first wiring 15 and the metal plate 11, so that a fourth via 24 is embedded in the prepared hole. Each of the first wirings 15 is formed in a predetermined pattern on the first insulating resin 21 and is covered with the second insulating resin 22. The second insulating resin 22 covers the first wirings 15 and includes prepared holes each at a predetermined position between a first wiring 15 and a second wiring 16, so that a second via 19 is embedded in the prepared hole. Each of the second wirings 16 is formed in a predetermined pattern on the second insulating resin 22 and is covered with the third insulating resin 23. The third insulating resin 23 covers the second wirings 16 and includes prepared holes each at a predetermined position between a second wiring 16 and a third wiring 17, so that a second via 19 is embedded in the prepared hole. Each of the third wirings 17 is formed in a predetermined pattern on the third insulating resin 23 and includes an external connection terminal of the semiconductor device. Each of the third wirings 17 is electrically connected to a corresponding electrode terminal 14 of the semiconductor element 12 via a third via 20, a second wiring 16, a second via 19, a first wiring 15, and a first via 18. The pitch of the electrode terminals 14 is narrower than that of the external connection terminals of the third wirings 17.

For example, the metal plate 11 is made of at least one metal selected from the group consisting of copper, silver, gold, nickel, aluminum, and palladium or an alloy primarily containing these elements. In particular, it is desirable that the metal plate 11 be made of copper, from a viewpoint of the electrical resistance value and cost. In the present example, copper was used for the metal plate II.

It is preferable that the metal plate 11 be applied to a planar ground layer or power supply layer. In this way, a ground layer or a power supply layer of the wiring board 30 incorporating the semiconductor element 12 can be deleted or the area of the ground layer or the power supply layer can be decreased. Thus, improvement in the design freedom of signal wirings and reduction in the number of wiring layers can be expected.

Further, since the metal plate 11 is electrically connected to the wiring board 30 via the fourth vias 24, the metal plate 11 functions as an electromagnetic shield. Thus, reduction of unwanted electromagnetic radiation can be expected.

In addition, via lands of a metal layer may be arranged on the metal plate 11. In this way, adhesion between the fourth vias 24 and the metal plate 11 can be improved.

Additionally, while the wiring board 30 incorporating the semiconductor element is arranged on a surface of the metal plate 11, since the opposite surface of the metal plate 11 is planar, a heat sink or other components can be stably and accurately connected on this surface.

The thickness of the semiconductor element 12 can be adjusted based on a desired thickness of the semiconductor device. In the present example, the semiconductor element 12 was formed to have a thickness of 30 to 50 μm. While FIG. 1 illustrates only one semiconductor element 12, a plurality of semiconductor elements 12 may be formed.

For example, the first wirings 15, the second wirings 16, and the third wirings 17 are made of at least one metal selected from the group consisting of copper, silver, gold, nickel, aluminum, and palladium or an alloy primarily containing these elements. In particular, it is desirable that the wirings be made of copper, from a viewpoint of the electrical resistance value and cost. In the present example, copper was used for the first wirings 15, the second wirings 16, and the third wirings 17.

It is desirable that the first wirings 15 be used as a ground layer or a power supply layer. However, the first wirings 15 are not limited to such use. If the first wirings 15 are used a ground layer or a power supply layer, by electrically connecting the first wirings 15 and the metal plate 11, electric characteristics of the ground or the power supply of the semiconductor device can be improved.

In addition, by using the first wirings 15 and the fourth vias 24 as heat radiation paths, heat generated from the semiconductor element 12 can efficiently be released to the metal plate 11.

In addition, solder resist (not illustrated) may be arranged so that portions of the third wirings 17 are open. In this way, when solder is applied to the third wirings 17, flow of the solder to areas other than the third wirings 17 can be prevented. Thus, the surface can be protected.

For example, the first vias 18, the second vias 19, the third vias 20, and the fourth vias 24 are made of at least one metal selected from the group consisting of copper, silver, gold, nickel, aluminum, and palladium or an alloy primarily containing these elements. In particular, it is desirable that the vias be made of copper, from a viewpoint of the electrical resistance value and cost. In the present example, copper was used for the first vias 18, the second vias 19, the third vias 20, and the fourth vias 24.

For example, the first insulating resin 21, the second insulating resin 22, and the third insulating resin 23 are made of photosensitive or nonphotosensitive organic material. For example, epoxy resin, epoxy acrylate resin, urethane acrylate resin, polyester resin, phenol resin, polyimide resin, BCB (benzocyclobutene), PBO (polybenzoxazole), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB (benzocyclobutene), PBO (polybenzoxazole), polynorbornene resin, or the like may be used as the organic material. In the present example, the first insulating resin 21, the second insulating resin 22, and the third insulating resin 23 are made of epoxy resin as a nonphotosensitive resin.

The first insulating resin 21, the second insulating resin 22, and the third insulating resin 23 may be made of different insulating materials. For example, if the insulating material of the third insulating resin 23 is more elastic than that of the first insulating resin 21, a warp in the package can be reduced.

The number of wiring layers of the wiring board 30 is not limited to three. An arbitrary number of wiring layers may be used, as long as a plurality of layers are used. In the present example, three wiring layers and three insulating resin layers were used.

In addition, the wiring board 30 may include a capacitor functioning as a circuit noise filter at a desired position in each layer. It is preferable that examples of the dielectric material used to form such capacitor include: metal oxide such as titanium oxide, tantalum oxide, $Al_2O_3$, $SiO_2$, $ZrO_2$, $HfO_2$, or $Nb_2O_5$; perovskite-type material such as BST ($Ba_xSr_{1-x}TiO_3$), AZT ($PbZr_xTi_{1-x}O_3$), or PLZT ($Pb_{1-y}La_yZr_xTi_{1-x}O_3$); and Bi-based layer compound such as $SrBi_2Ta_2O_9$ ($0 \leq x \leq 1$, $0 < y < 1$). Alternatively, for example, an organic material to which an inorganic material or a magnetic material is added may be used as the dielectric material forming the capacitor. In addition, other than the semiconductor element and the capacitors, discrete components may be arranged.

Figure 2:
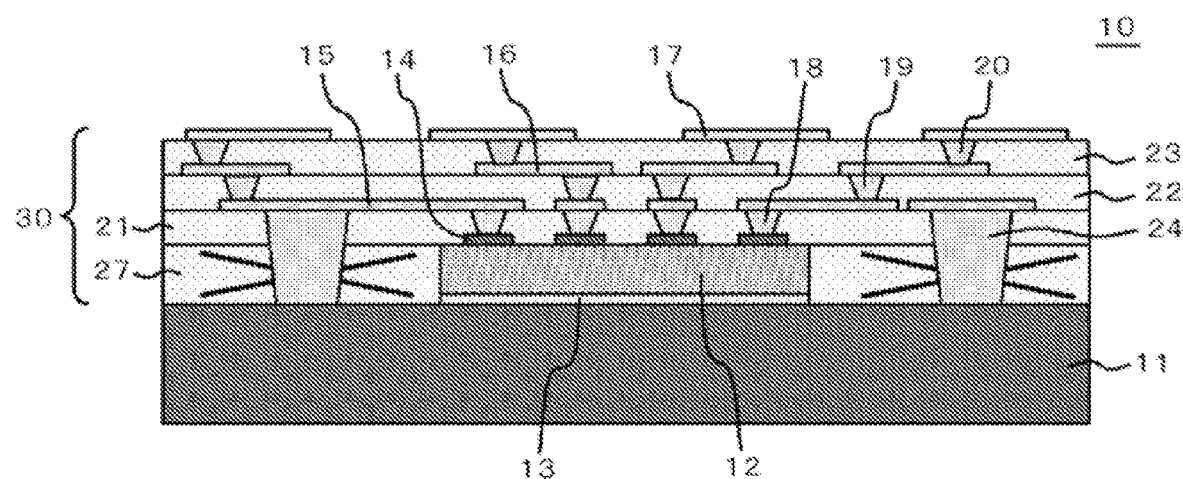
FIG. 2 is a sectional view schematically illustrating a configuration of variation 1 of the semiconductor device according to example 1 of the present invention.

In addition, as illustrated in FIG. 2 (variation 1), a prepreg 27 including reinforcement material may be arranged around the semiconductor element 12. In this way, a warp in the semiconductor device can be reduced.

Figure 3:
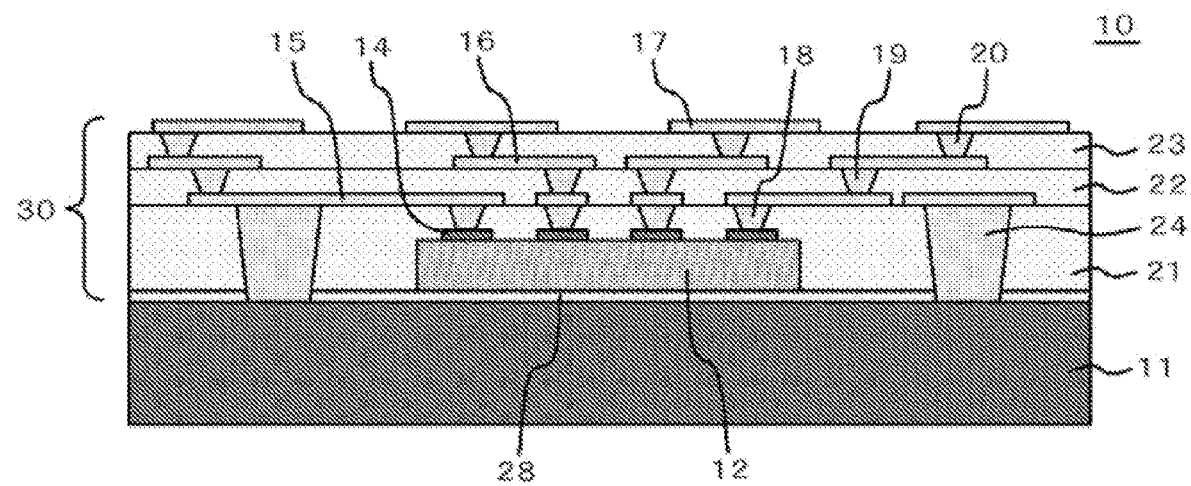
FIG. 3 is a sectional view schematically illustrating a configuration of variation 2 of the semiconductor device according to example 1 of the present invention.

In addition, as illustrated in FIG. 3 (variation 2), a bonding layer 28 covering not only the area in which the semiconductor element 12 and the metal plate 11 overlap but also a whole surface of the metal plate 11 may be arranged. In this way, since no bonding layer needs to be arranged on the semiconductor element 12 in advance, man hours can be reduced. Further, by arranging the bonding layer 28 with the same material as the insulating material (first insulating resin 21 in this example) around the semiconductor element 12, peeling of the bonding layer 28 from the metal plate 11 or a warp, which is caused by the bonding layer 28, can be prevented.

Figure 4:
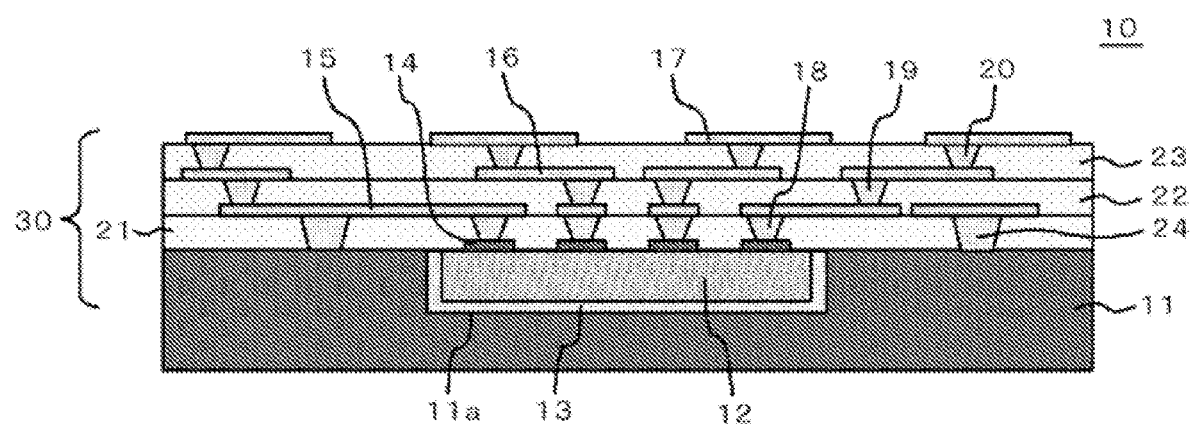
FIG. 4 is a sectional view schematically illustrating a configuration of variation 3 of the semiconductor device according to example 1 of the present invention.

In addition, as illustrated in FIG. 4 (variation 3), a recessed portion 11a may be arranged in the metal plate 11 to arrange the semiconductor element 12 in the recessed portion 11a via the bonding layer 13. In this way, since the height of the fourth vias 24 connecting the first wirings 15 and the metal plate 11 can be decreased, the process time for forming the vias can be shortened, and the vias can be arranged at high density. In addition, no insulating resin needs to be arranged around the semiconductor element 12. It is simply necessary to arrange insulating resin only on the electrode terminals 14 of the semiconductor element 12. Thus, freedom in the selection of the insulating resin used is increased. Namely, not only a thick film resin having a thickness enough to cover the height of the semiconductor element 12, but also a thin film resin can be used.

Figure 5:
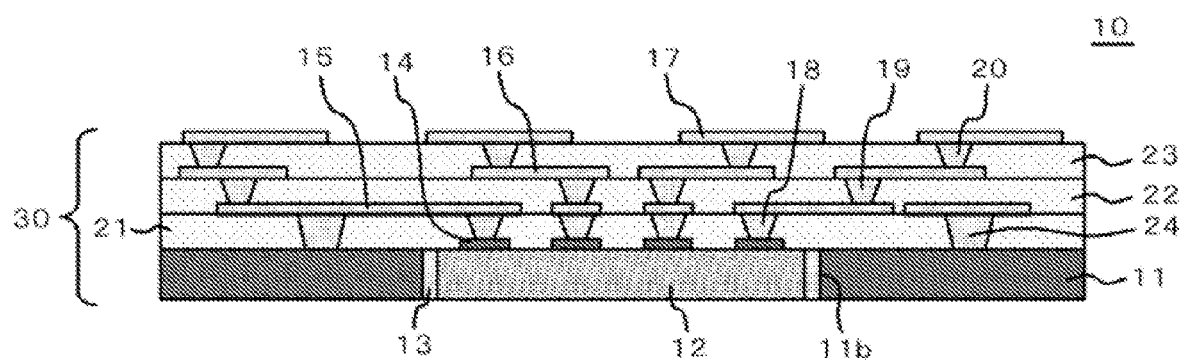
FIG. 5 is a sectional view schematically illustrating a configuration of variation 4 of the semiconductor device according to example 1 of the present invention.

In addition, as illustrated in FIG. 5 (variation 4), an opening 11b may be arranged in the metal plate 11 to arrange the semiconductor element 12 in the opening 11b via the bonding layer 13. The surface opposite to the electrode terminals 14 of the semiconductor element 12 may be exposed from the metal plate 11. In this way, since the height of the fourth vias 24 connecting the first wirings 15 and the metal plate 11 can be decreased, the process time for forming the vias can be shortened, and the vias can be arranged at high density. In addition, no insulating resin needs to be arranged around the semiconductor element 12. It is simply necessary to arrange insulating resin only on the electrode terminals 14 of the semiconductor element 12. Thus, freedom in the selection of the insulating resin used is increased. Namely, not only a thick film resin having a thickness enough to cover the height of the semiconductor element 12, but also a thin film resin can be used. In addition, since the metal plate 11 has the same thickness as that of the semiconductor element 12, a thin package can be realized.

Figure 6:
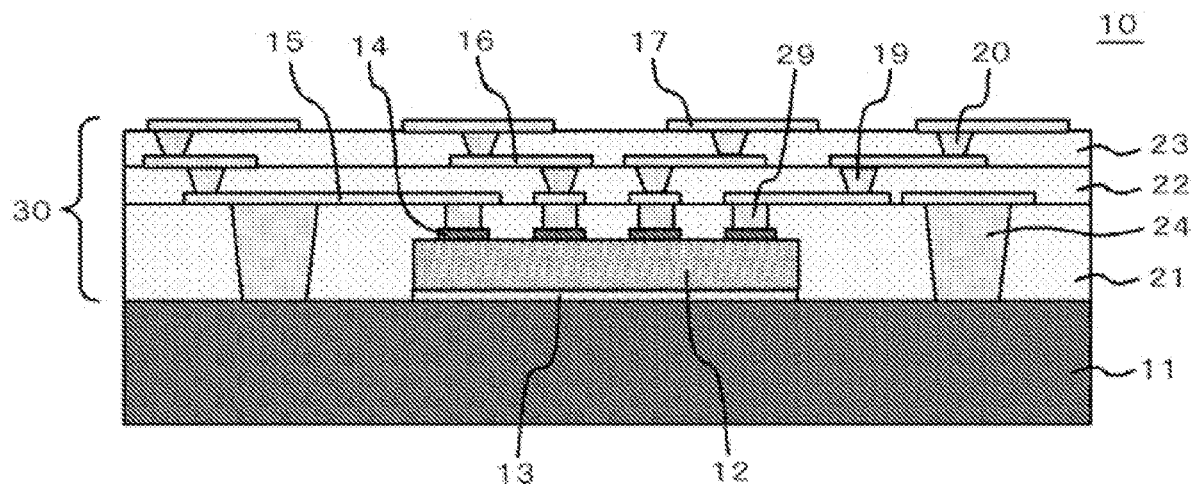
FIG. 6 is a sectional view schematically illustrating a configuration of variation 5 of the semiconductor device according to example 1 of the present invention.

In addition, as illustrated in FIG. 6 (variation 5), metal posts 29 may be arranged above the semiconductor element, that is, on the electrode terminals 14 of the semiconductor element 12. The metal posts 29 may be allowed to function as vias. If the pitch of the electrode terminals 14 is narrow, small-diameter vias most suitable for the pitch need to be formed after the semiconductor element is incorporated in the resin. However, in this way, there is no need to form such vias. Thus, since defective connection and yield decrease attributable to small-diameter vias are eliminated, reliable semiconductor devices 10 can be realized in high yield.

Based on the semiconductor device 10 according to example 1, since the predetermined conductors (the wirings 15, 16, and 17 and the vias 18, 19, and 20) of the wiring board 30 are connected to the metal plate 11 via the fourth vias 24, improvement in characteristic impedance, reduction in unwanted electromagnetic radiation, and improvement in heat radiation characteristics can be realized.

Figure 8:
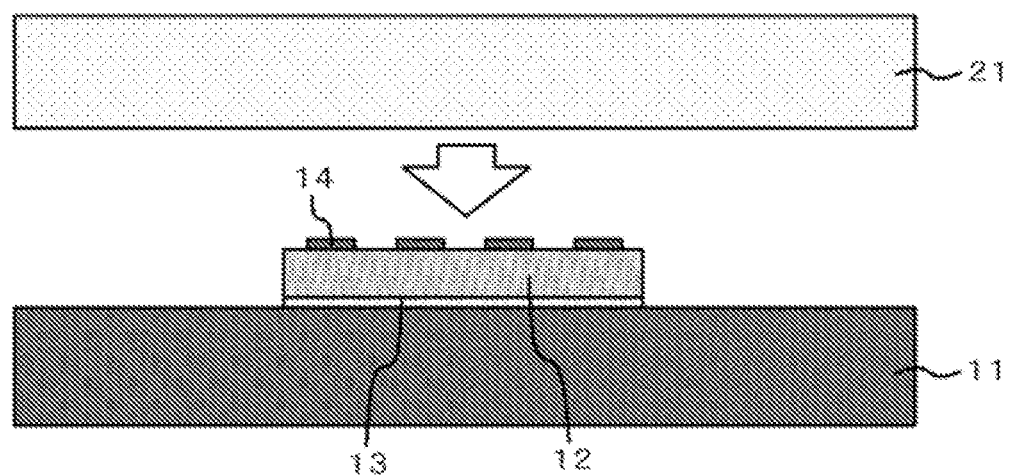
FIG. 8 is a sectional view illustrating a stacking insulating resin on a metal plate in the manufacturing method of the semiconductor device according to example 1 of the present invention.
Figure 9:
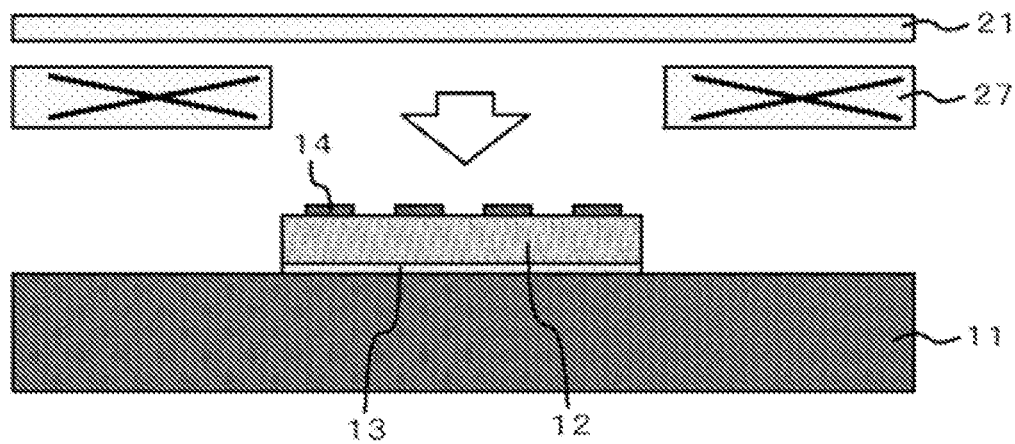
FIG. 9 is a sectional view illustrating a variation (corresponding to variation 1 (FIG. 2)) of the stacking insulating resin on a metal plate in the manufacturing method of the semiconductor device according to example 1 of the present invention.

Next, a manufacturing method of the semiconductor device according to example 1 of the present invention will be described with reference to the drawings. FIGS. 7A-7D schematically illustrates sectional views of the manufacturing method of the semiconductor device according to example 1 of the present invention. FIG. 8 is a sectional view illustrating a stacking insulating resin on a metal plate in the manufacturing method of the semiconductor device according to example 1 of the present invention. FIG. 9 is a sectional view illustrating a variation (corresponding to variation 1 (FIG. 2)) of the stacking insulating, resin on a metal plate in the manufacturing method of the semiconductor device according to example 1 of the present invention. FIGS. 10A-10E and 11 are sectional views schematically illustrating a variation (corresponding to variation 5 (FIG. 6)) in the manufacturing method of the semiconductor device according to example 1 of the present invention.

First, the metal plate 11 is prepared (step A1). It is preferable that a positioning mark for mounting the semiconductor element 12 be arranged on the metal plate 11. As long as the positioning mark can be recognized accurately and can function properly, the positioning mark may be arranged by causing metal to deposit on the metal plate 11 or by forming a depression through wet etching or mechanical processing. In the present example, a copper plate having a thickness of 0.5 mm was used as the metal plate II, and the positioning mark was made of nickel (5 μm) and formed on the metal plate 11 through electroplating.

Next, on the metal plate 11 on which the positioning mark has been arranged, the semiconductor element 12 is stacked via the bonding layer 13, with the electrode-terminal-14-side surface up (see step A2; FIG. 7A).

Next, the first insulating resin 21 is stacked on the metal plate 11 so that the first insulating resin 21 covers the electrode-terminal-14-side surface and the side end surfaces of the semiconductor element 12 (see step A3; FIG. 7B). As illustrated in FIG. 8, the film-type first insulating resin 21 can be stacked so that the film-type first insulating resin 21 covers the electrode-terminal-14-side surface and the side end surfaces of the semiconductor element 12 at once. Alternatively, as illustrated in FIG. 9, the electrode-terminal-14-side surface and the side end surfaces of the semiconductor element 12 may be covered separately by stacking insulating resins. The resin is stacked by a transfer molding method, a compression molding method, a printing method, vacuum pressing, vacuum lamination, a spin coating method, a die coating method, a curtain coating method, or the like. In the present example, epoxy resin was used as the insulating resin and stacked by vacuum lamination on the electrode terminal 14 surface and the side surface of the semiconductor element 12 at once. The first insulating resin 21 is not limited to the film-type insulating resin. A liquid insulating resin may be hardened.

Next, prepared holes for the first vias 18 and the fourth vias 24 are formed in the first insulating resin 21 on the electrode terminals 14 and the metal plate 11, and the first vias 18 and the fourth vias 24 are formed in the prepared holes. Thereafter, the first wirings 15 are formed on the first insulating resin 21 including the first vias 18 and the fourth vias 24 (see step A4; FIG. 7C).

If the first insulating resin 21 is made of photosensitive material, the prepared holes are formed by photolithography. If the first insulating resin 21 is made of nonphotosensitive material or photosensitive material having a low pattern resolution, the prepared holes are formed by a laser processing method, a dry etching method, or a blasting method. In the present example, a laser processing method was used.

Figure 10A:
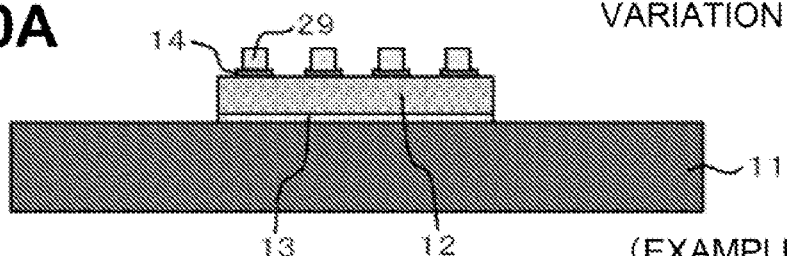
FIGS. 10A-10E schematically illustrate first sectional views of a variation (corresponding to variation 5 (FIG. 6)) in the manufacturing method of the semiconductor device according to example 1 of the present invention.
Figure 10B:
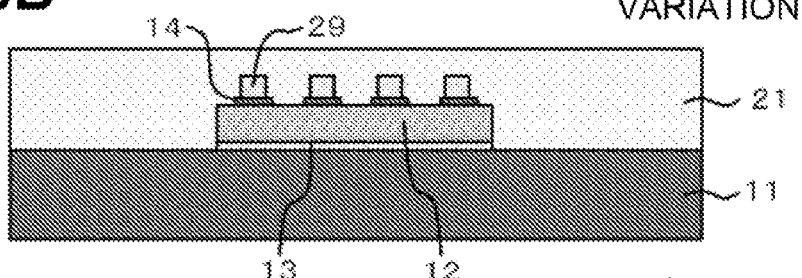
Figure 10C:
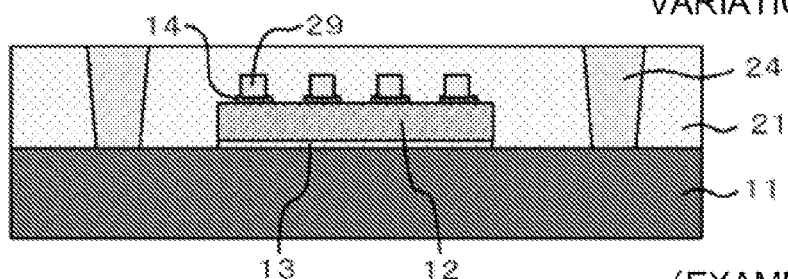
Figure 10D:
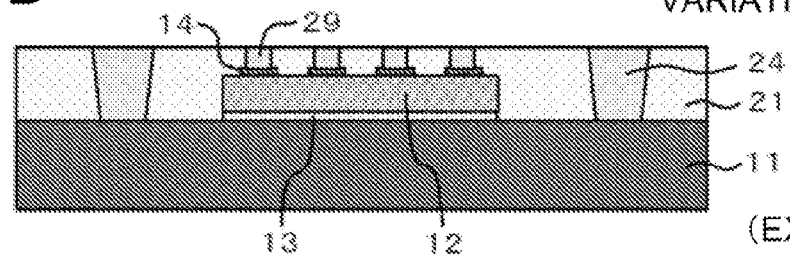
Figure 10E:
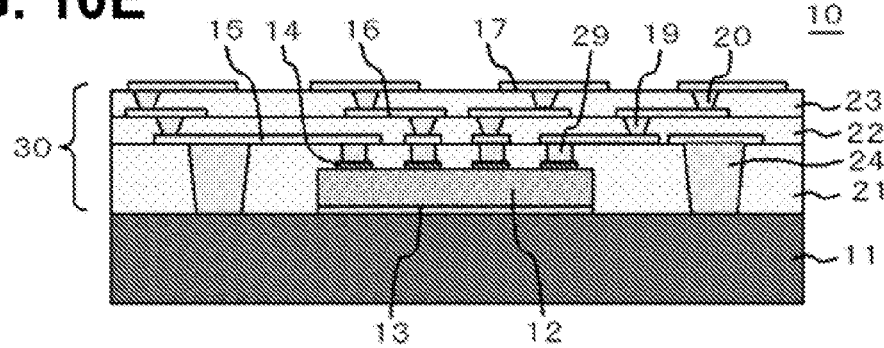

The first vias 18 and the fourth vias 24 are formed by an electroplating method, an electroless plating method, a printing method, a molten metal suction method, or the like. Alternatively, as illustrated in FIGS. 10A-10E and 11, the first vias 18 above the semiconductor element 12 may be formed by arranging conducting metal posts 29 in advance on the electrode terminals 14, forming the first insulating resin 21, and scraping the surface of the insulating resin by polishing or the like until the surface of each of the metal posts 29 is exposed. In this case, as illustrated in FIGS. 10A to 10E, after the fourth vias 24 are formed, the surface of the first insulating resin 21 may be scraped until the surface of each of the metal posts 29 is exposed. Alternatively, as illustrated in FIGS. 11A to 10E, after the surface of the first insulating resin 21 is scraped until the surface of each of the metal posts 29 is exposed, the fourth vias 24 may be formed.

In addition, the first wirings 15 can be formed by a subtractive process, a semi-additive process, a fully-additive process, or the like. The subtractive process is a method for obtaining a desired pattern by forming a resist of a desired pattern on a copper foil arranged on a board, etching unnecessary copper foil, and exfoliating the resist. The semi-additive process is a method for obtaining a desired wiring pattern by forming a feed layer through an electroless plating method, a sputtering method, a CVD (Chemical Vapor Deposition) method, or the like, forming a resist having openings of a desired pattern, causing metal to deposit in the openings of the resist through an electroplating method, removing the resist, and etching the feed layer. A fully-additive process is a method for obtaining a desired wiring pattern by adsorbing an electroless plating catalyst on a board, forming a resist pattern, activating the catalyst while leaving the resist as an insulating film, and causing metal to deposit in the openings of the insulating film through an electroless plating method.

Next, by repeating the forming of the insulating resin, the vias, and the wirings a predetermined number of times based on the desired number of layers, the second insulating resin 22, the second vias 19, the second wirings 16, the third insulating resin 23, the third vias 20, and the third wirings 17 are formed on the first insulating resin 21 including the first wirings 15 (see step A5; FIG. 7D). In the present example, three wiring layers are illustrated in FIG. 7D. However, the present invention is not limited to such example.

Based on the manufacturing method of the semiconductor device according to example 1, the semiconductor device 10 can be manufactured efficiently.

Example 2

Figure 12:
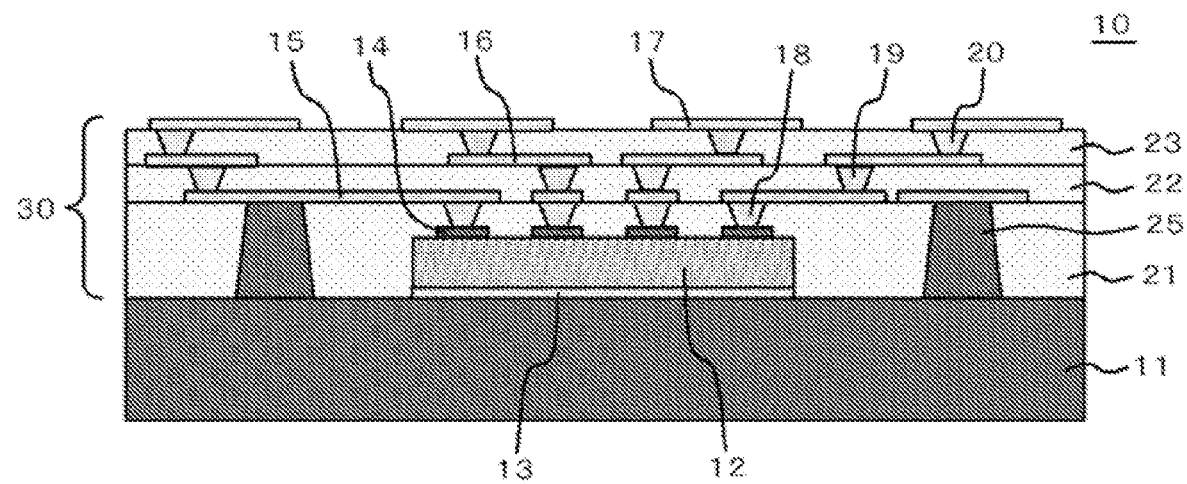
FIG. 12 is a sectional view schematically illustrating a configuration of a semiconductor device according to example 2 of the present invention.

A semiconductor device according to example 2 of the present invention will be described with reference to the drawings. FIG. 12 is a sectional view schematically illustrating a configuration of the semiconductor device according to example 2 of the present invention.

The semiconductor device 10 according to example 2 includes metal posts 25, instead of the fourth vias (24 in FIG. 1) included in the semiconductor device (10 in FIG. 1) according to example 1. Other configurations are the same as those according to the example 1.

The metal posts 25 are formed on the metal plate II in advance before the first insulating resin 21 is stacked. The metal posts 25 are embedded in the first insulating resin 21, and each of the metal posts 25 electrically connects a corresponding first wiring 15 to the metal plate 11. While it is desirable that the metal posts 25 be made of the same material as the metal plate 11, other material may be used. In the present example, copper was used, which was the same material used to form the metal plate.

In addition, since the metal plate 11 is electrically connected to the wiring board 30 via the metal posts 25, the metal plate 11 functions as an electromagnetic shield. Thus, reduction in unwanted electromagnetic radiation can be expected.

In addition, by using the first wirings 15 and the metal posts 25 as heat radiation paths, heat generated from the semiconductor element 12 can efficiently be released to the metal plate II.

Based on the semiconductor device according to example 2, since the predetermined conductors (the wirings 15, 16, and 17 and the vias 18, 19, and 20) of the wiring board 30 are connected to the metal plate 11 via the metal posts 25, improvement in characteristic impedance, reduction in unwanted electromagnetic radiation, and improvement in heat radiation characteristics are realized. In addition, since the first wirings 15 of the wiring board 30 incorporating the semiconductor element are connected to the metal plate II via the metal posts 25 of which thickness can be arbitrarily adjusted, the thickness of the incorporated semiconductor element 12 is not limited. In addition, since the metal posts 25 are reliably connected to the metal plate 11 or to the first wirings 15, reliability of the semiconductor device 10 is improved.

The semiconductor device according to example 2 may adopt any one of the configurations corresponding to the variations (variations 1 to 5) according to example 1 illustrated in FIGS. 2 to 6.

Next, a manufacturing method of the semiconductor device according to example 2 of the present invention will be described with reference to the drawings. FIGS. 13A-13E schematically illustrates sectional views of the manufacturing method of the semiconductor device according to example 2 of the present invention.

First, the metal plate 11 on which the metal posts 25 are arranged is prepared (see step B1; FIG. 13A). It is preferable that a positioning mark for mounting the semiconductor element 12 be arranged on the metal plate 11. As long as the positioning mark can be recognized accurately and can function properly, the positioning mark may be arranged by causing metal to deposit on the metal plate 11 or by forming a depression through wet etching or mechanical processing. In the present example, a copper plate having a thickness of 0.5 mm was used as the metal plate 11, and the positioning mark was made of nickel (5 μm) and formed on the metal plate 11 through electroplating. The metal posts 25 may be formed by causing the metal posts 25 to deposit on the metal plate 11 or by etching the metal plate 11. In the present example, after an etching mask was formed on the metal plate 11, the metal posts 25 were formed by etching.

Next, on the metal plate 11 on which the positioning mark has been arranged, the semiconductor element 12 is stacked via the bonding layer 13, with the electrode-terminal-14-side surface up (see step B2; FIG. 13B).

Next, the first insulating resin 21 is stacked on the metal plate 11 so that the first insulating resin 21 covers the electrode-terminal-14-side surface and the side end surfaces of the semiconductor element 12 (step B3; FIG. 13C). The first insulating resin 21 can be stacked by a transfer molding method, a compression molding method, a printing method, vacuum pressing, vacuum lamination, a spin coating method, a die coating method, a curtain coating method, or the like. In the present example, the first insulating resin 21 was made of epoxy resin and stacked by vacuum lamination.

Next, the surface of the first insulating resin 21 is scraped by polishing or the like to expose the surface of each of the metal posts 25 (see step B4; FIG. 13D).

Next, prepared holes for the first vias 18 are formed in the first insulating resin 21 on the electrode terminals 14, and the first vias 18 are formed in the prepared holes. Thereafter, the first wirings 15 are formed on the first insulating resin 21 including the first vias 18 and the metal posts 25 (see step B5; FIG. 13E).

If the first insulating resin 21 is made of photosensitive material, the prepared holes are formed by photolithography. If the first insulating resin 21 is made of nonphotosensitive material or photosensitive material having a low pattern resolution, the prepared holes are formed by a laser processing method, a dry etching method, or a blasting method. In the present example, a laser processing method was used.

The first vias 18 are formed by an electroplating method, an electroless plating method, a printing method, a molten metal suction method, or the like. Alternatively, the first vias 18 above the semiconductor element 12 may be formed by arranging conducting metal posts in advance on the electrode terminals 14, forming the first insulating resin 21, and scraping the surface of the insulating resin by polishing or the like until the surface of each of the metal posts is exposed.

In addition, the first wirings 15 can be formed by a subtractive process, a semi-additive process, a fully-additive process, or the like.

Next, by repeating the forming of the insulating resin, the vias, and the wirings a predetermined number of times based on the desired number of layers, the second insulating resin 22, the second vias 19, the second wirings 16, the third insulating resin 23, the third vias 20, and the third wirings 17 are formed on the first insulating resin 21 including the first wirings 15 (see step B6; FIG. 13E). In the present example, three wiring layers are illustrated in FIG. 13E. However, the present invention is not limited to such example.

Based on the manufacturing method of the semiconductor device according to example 2, the semiconductor device 10 can be manufactured efficiently. In addition, since the first wirings 15 of the wiring board 30 incorporating the semiconductor element are connected to the metal plate 11 via the metal posts 25 of which thickness can be arbitrarily adjusted, the thickness of the incorporated semiconductor element 12 is not limited. In addition, since the metal posts 25 are reliably connected to the metal plate 11 or to the first wirings 15, reliability of the semiconductor device 10 is improved.

Example 3

Figure 14:
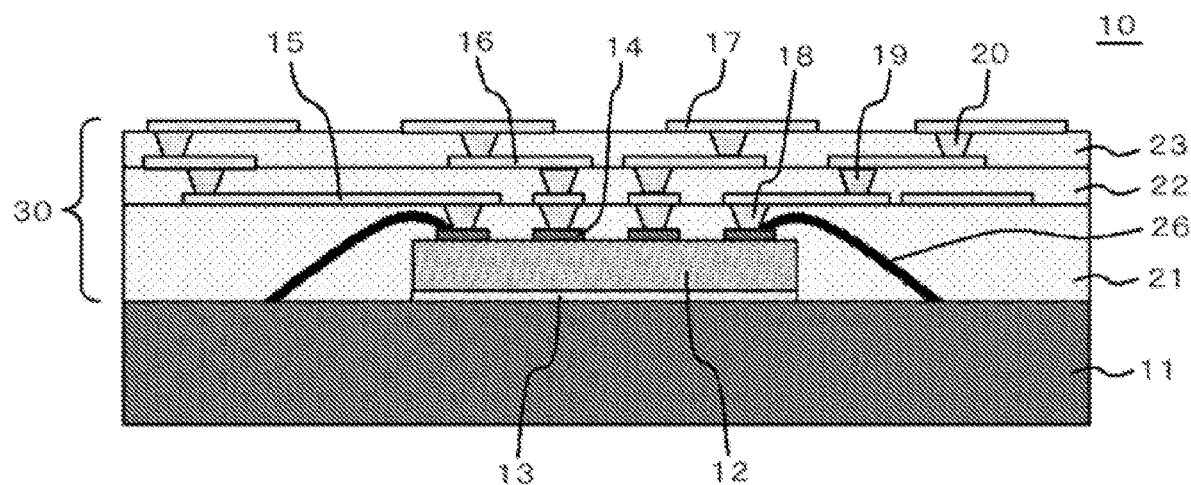
FIG. 14 is a sectional view schematically illustrating a configuration of a semiconductor device according to example 3 of the present invention.
Figure 16:
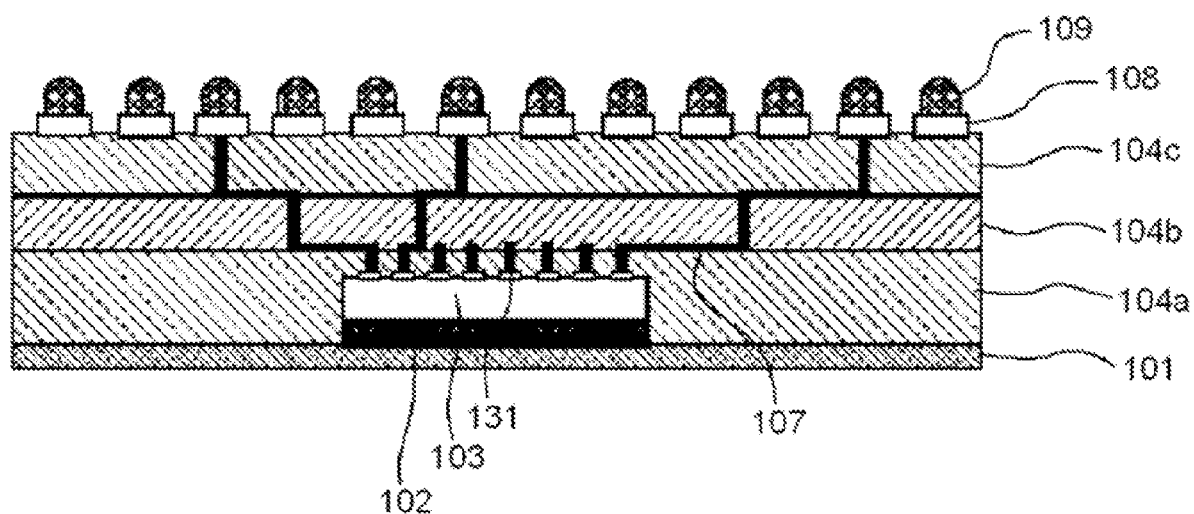
FIG. 16 is a sectional view schematically illustrating a configuration of a board incorporating a semiconductor element according to conventional example 1.
Figure 17:
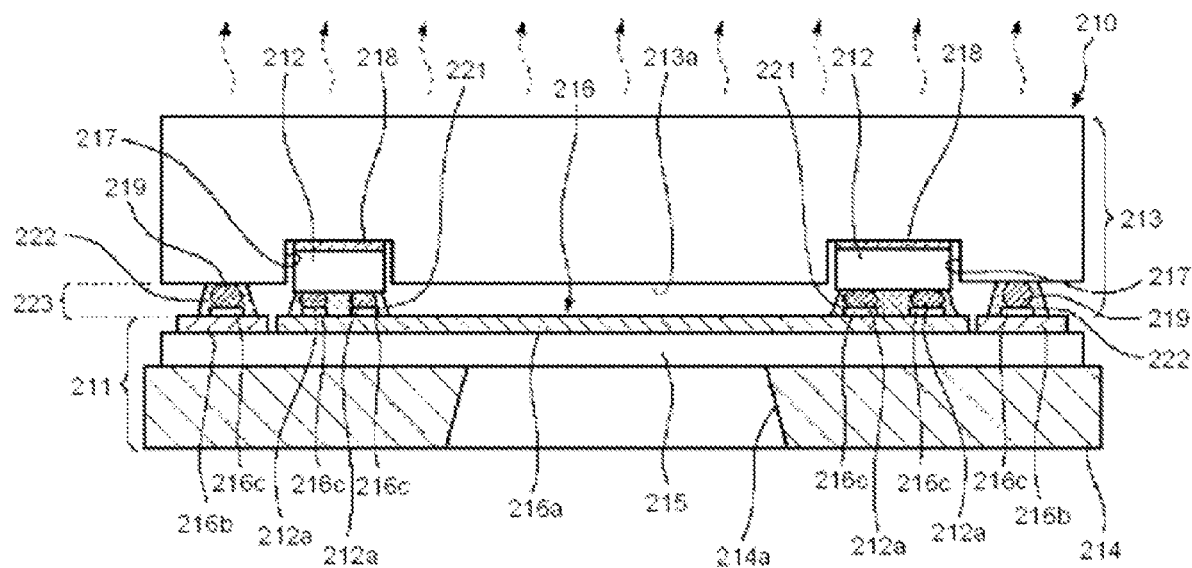
FIG. 17 is a sectional view schematically illustrating a configuration of an electronic component mount board according to conventional example 2.
Figure 18:
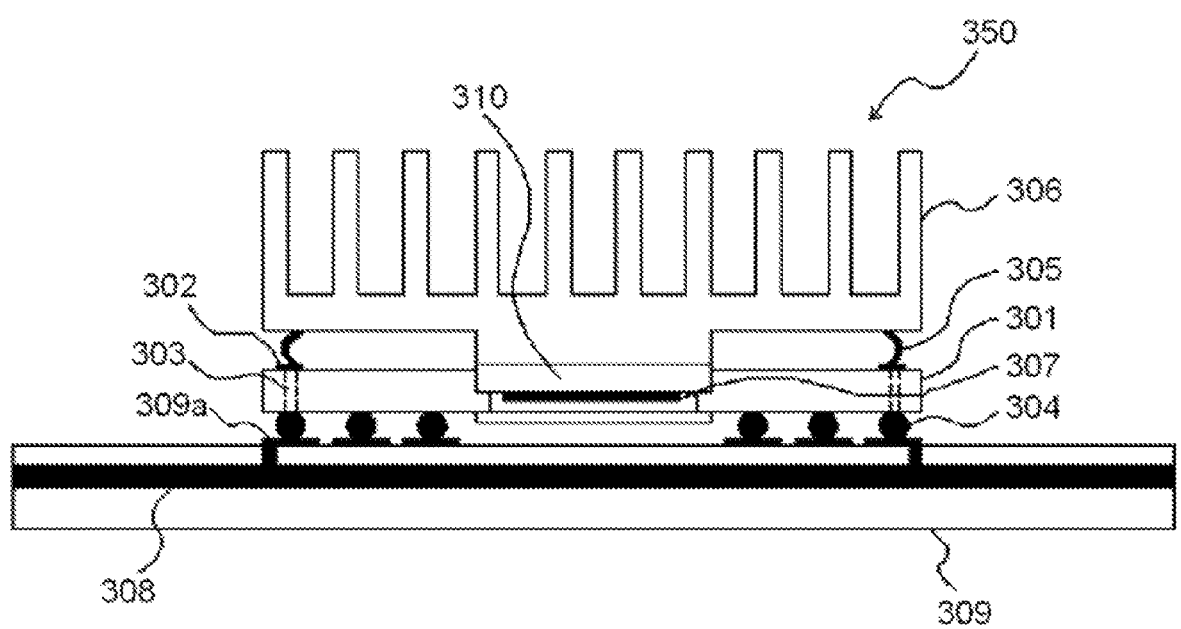
FIG. 18 is a sectional view schematically illustrating a configuration of an LSI package according to conventional example 3.

A semiconductor device according to example 3 of the present invention will be described with reference to the drawings. FIG. 14 is a sectional view schematically illustrating a configuration of the semiconductor device according to example 3 of the present invention.

The semiconductor device 10 according to example 2 includes bonding wires 26, instead of the fourth vias (24 in FIG. 1) included in the semiconductor device (10 in FIG. 1) according to example 1. Other configurations are the same as those according to the example 1.

The bonding wires 26 electrically connect predetermined electrode terminals 14 to the metal plate 11. The bonding wires 26 are embedded in the first insulating resin 21. While it is desirable that the bonding wires 26 be gold wires and copper wires, the present invention is not limited to such example. In the present example, gold wires were used.

Further, it is desirable that the electrode terminals 14 connected to the metal plate 11 via the bonding wires 26 be used as a ground layer or power supply layer. However, the present invention is not limited to such example. If the electrode terminals 14 are used as a ground layer or power supply layer, by electrically connecting the electrode terminals 14 and the metal plate 11, ground or power supply electric characteristics of the semiconductor device can be improved.

In addition, since the metal plate 11 is electrically connected to the wiring board 30 via the bonding wires 26, the metal plate 11 functions as an electromagnetic shield. Thus, reduction in unwanted electromagnetic radiation can be expected.

In addition, by using the first wirings 15 and the bonding wires 26 as heat radiation paths, heat generated from the semiconductor element 12 can efficiently be released to the metal plate 11.

Based on the semiconductor device according to example 3, since the predetermined conductors (the wirings 15, 16, and 17 and the vias 18, 19, and 20) of the wiring board 30 are connected to the metal plate 11 via the bonding wires 26, improvement in characteristic impedance, reduction in unwanted electromagnetic radiation, and improvement in heat radiation characteristics can be realized. In addition, since the first wirings 15 of the wiring board 30 are connected to the metal plate 11 via the inexpensive bonding wires 26, the semiconductor device 10 can be realized at low cost.

The semiconductor device according to example 3 may adopt any one of the configurations corresponding to the variations (variations 1 to 5) according to example 1 illustrated in FIGS. 2 to 6.

Next, a manufacturing method of the semiconductor device according to example 3 of the present invention will be described with reference to the drawings. FIGS. 15A-15E schematically illustrates sectional views of the manufacturing method of the semiconductor device according to example 3 of the present invention.

First, the metal plate 11 is prepared (step C1). It is preferable that a positioning mark for mounting the semiconductor element 12 be arranged on the metal plate 11. As long as the positioning mark can be recognized accurately and can function properly, the positioning mark may be arranged by causing metal to deposit on the metal plate 11 or by forming a depression through wet etching or mechanical processing. In the present example, a copper plate having a thickness of 0.5 mm was used as the metal plate 11, and the positioning mark was made of nickel (5 μm) and formed on the metal plate 11 through electroplating.

Next, on the metal plate 11 on which the positioning mark has been arranged, the semiconductor element 12 is stacked via the bonding layer 13, with the electrode-terminal-14-side surface up (see step C2; FIG. 15A).

Next, predetermined electrode terminals 14 of the semiconductor element 12 are connected to the metal plate 11 via the bonding wires 26 (see step C3; FIG. 15B).

Next, the first insulating resin 21 is formed on the metal plate 11 so that the first insulating resin 21 covers the electrode-terminal-14-side surface and the side end surfaces of the semiconductor element 12 and the bonding wires 26 (see step C4; FIG. 15C). The first insulating resin 21 can be formed by a transfer molding method, a compression molding method, a printing method, vacuum pressing, vacuum lamination, a spin coating method, a die coating method, a curtain coating method, or the like. In the present example, the insulating resin was made of epoxy resin and stacked by vacuum lamination.

Next, prepared holes for the first vias 18 are formed in the first insulating resin 21 on the electrode terminals 14, and the first vias 18 are formed in the prepared holes. Thereafter, the first wirings 15 are formed on the first insulating resin 21 including the first vias 18 (see step C4; FIG. 15D).

If the first insulating resin 21 is made of photosensitive material, the prepared holes are formed by photolithography. If the first insulating resin 21 is made of nonphotosensitive material or photosensitive material having a low pattern resolution, the prepared holes are formed by a laser processing method, a dry etching method, or a blasting method. In the present example, a laser processing method was used.

The first vias 18 are formed by an electroplating method, an electroless plating method, a printing method, a molten metal suction method, or the like. Alternatively, the first vias 18 above the semiconductor element 12 may be formed by arranging conducting metal posts in advance on the electrode terminals 14, forming the first insulating resin 21, and scraping the surface of the insulating resin by polishing or the like until the surface of each of the metal posts is exposed.

In addition, the first wirings 15 can be formed by an electroplating method, an electroless plating method, a printing method, a molten metal suction method, or the like.

Next, by repeating the forming of the insulating resin, the vias, and the wirings a predetermined number of times based on the desired number of layers, the second insulating resin 22, the second vias 19, the second wirings 16, the third insulating resin 23, the third vias 20, and the third wirings 17 are formed on the first insulating resin 21 including the first wirings 15 (see step C5; FIG. 15E). In the present example, three wiring layers are illustrated in FIG. 15E. However, the present invention is not limited to such example.

Based on the manufacturing method of the semiconductor device according to example 3, the semiconductor device 10 can be manufactured efficiently. In addition, since the electrode terminals 14 of the semiconductor element are connected to the metal plate 11 via the inexpensive bonding wires 26, the semiconductor device 10 can be realized at low cost.

Modifications and adjustments of the exemplary embodiments and examples are possible within the scope of the overall disclosure (including claims) of the present invention and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

EXPLANATION OF SYMBOLS 10 semiconductor device
11 metal plate
11a recessed portion
11b opening
12 semiconductor element
13 bonding layer
14 electrode terminal
15 first wiring (wiring layer, first wiring layer)
16 second wiring (wiring layer)
17 third wiring (wiring layer, external connection terminal)
18 first via (via, first via)
19 second via (via)
20 third via (via)
21 first insulating resin (insulating layer, first insulating layer)
22 second insulating resin (insulating layer)
23 third insulating resin (insulating layer)
24 fourth via (second via)
25 metal post
26 bonding wire
27 prepreg
28 bonding layer
29 metal post (second metal post)
30 wiring board
101 metal heat sink
102 metal paste
103 IC chip
104a, 104b, 104c insulating layer resin layer
107 wiring conductor
108 BGA mount pad
109 BGA solder bump
131 IC-side mount pad
210 electronic component mount board
211 wiring board portion
212 mount component
212a solder bump
213 heat radiation board portion
213a bottom surface
214 main board
214a trench
215 dielectric film
216 conductor pattern
216a circuit-side pattern
216b ground-side pattern
216c pad 217 recessed portion
218 thermally conductive layer
219 solder bump
221 bonding layer
222 bonding layer
223 air layer
301 LSI package
302 pad
303 via hole
304 ground pin
305 metal contact
306 heat sink
307 LSI chip
308 wound planar layer
309 print board
309a LSI mount pad
310 heat spreader
350 LSI shield apparatus

The invention claimed is:

1. A semiconductor device comprising:
   at least one semiconductor element having electrode terminals;
   a metal plate supporting the semiconductor element; and
   a wiring board covering the semiconductor element and including a plurality of insulating layers and wiring layers alternately stacked and external connection terminals on a surface thereof, the wiring layers being electrically connected to each other by vias,
   wherein the electrode terminals and the external connection terminals are electrically connected via at least one of the wiring layers and the vias, and
   wherein at least one of the electrode terminals, the wiring layers, and the vias is electrically connected to the metal plate;
   wherein the electrode terminals and the metal plate are electrically connected to each other via a bonding wire.

2. The semiconductor device according to claim 1, wherein a pitch of the electrode terminals is narrower than a pitch of the external connection terminals.

3. The semiconductor device according to claim 1, wherein insulating material of one of the insulating layers is different from insulating material of the other insulating layers.

4. The semiconductor device according to claim 1, wherein the insulating layers covering the semiconductor element are formed so that insulating material covering side end surfaces of the semiconductor element is different from insulating material covering an electrode-terminal-side surface of the semiconductor element.

5. The semiconductor device according to claim 1, wherein the metal plate has a recessed portion in a semiconductor-element-side surface thereof, and
   wherein the semiconductor element is arranged in the recessed portion.

6. The semiconductor device according to claim 1, wherein the metal plate has an opening, and
   wherein the semiconductor element is arranged in the opening.

7. The semiconductor device according to claim 1, wherein a heat sink is arranged on a surface of the metal plate, the surface being opposite to the semiconductor-element-side surface thereof.

8. The semiconductor device according to claim 1, wherein a bonding layer is arranged at least between the metal plate and the semiconductor element.

9. The semiconductor device according to claim 8, wherein the bonding layer is formed of a same material as an insulating material of the insulating layer covering side end surfaces of the semiconductor element.

* * * * *